(12) United States Patent
Zhan et al.

(10) Patent No.: US 9,647,230 B2
(45) Date of Patent: May 9, 2017

(54) DISPLAY PANEL AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Hongming Zhan, Beijing (CN); Lifeng Lin, Beijing (CN); Chao Tian, Beijing (CN)

(73) Assignees: BOE TECHNOLOGY GROUP CO., LTD., Beijing (CN); BEIJING BOE DISPLAY TECHNOLOGY CO., LTD., Beijing (CN)

(*) Notice: Subject to any disclaimer, the term of this patent is extended or adjusted under 35 U.S.C. 154(b) by 0 days.

(21) Appl. No.: 14/800,946

(22) Filed: Jul. 16, 2015

(65) Prior Publication Data

US 2016/0276616 A1 Sep. 22, 2016

(30) Foreign Application Priority Data

Mar. 17, 2015 (CN) .......................... 2015 1 0117227

(51) Int. Cl.
*H01L 27/00* (2006.01)
*H01L 51/52* (2006.01)
*H01L 27/32* (2006.01)

(52) U.S. Cl.
CPC .......... *H01L 51/524* (2013.01); *H01L 27/322* (2013.01); *H01L 27/3272* (2013.01);
(Continued)

(58) Field of Classification Search
CPC .................................................. H01L 51/524
See application file for complete search history.

(56) References Cited

U.S. PATENT DOCUMENTS

2008/0309224 A1 12/2008 Kwak et al.
2014/0197388 A1* 7/2014 Zhang ................. H01L 51/5271
257/40

FOREIGN PATENT DOCUMENTS

CN 101211078 A 7/2008
CN 101290410 A 10/2008
(Continued)

OTHER PUBLICATIONS

First Office Action regarding Chinese application No. 201510117227.9, dated Sep. 13, 2016. Translation provided by Dragon Intellectual Property Law Firm.

*Primary Examiner* — William Harriston
(74) *Attorney, Agent, or Firm* — Harness, Dickey & Pierce, P.L.C.

(57) ABSTRACT

A display panel includes a first display surface, a second display surface, and a plurality of pixel units arranged in an array form between the two display surfaces. Each pixel unit includes an active light-emitting layer that emits light in a double-sided manner. A first light-emitting surface of the active light-emitting layer faces the first display surface, and a second light-emitting surface thereof faces the second display surface. The display panel further includes a first shielding layer that shields a portion of the first display surface and a second shielding layer that shields a portion of the second display surface. The first shielding layer includes a plurality of first shielding units, the second shielding layer includes a plurality of second shielding units, and the first shielding units and the second shielding units are arranged in a staggered manner in both a row direction and a column direction.

14 Claims, 3 Drawing Sheets

(52) U.S. Cl.
CPC ...... *H01L 27/3281* (2013.01); *H01L 51/5271* (2013.01); *H01L 51/5284* (2013.01); *H01L 2251/5323* (2013.01)

(56) References Cited

FOREIGN PATENT DOCUMENTS

| | | |
|---|---|---|
| CN | 102646697 A | 8/2012 |
| CN | 102768445 A | 11/2012 |
| CN | 103094312 A | 5/2013 |
| CN | 104102061 A | 10/2014 |
| CN | 104297968 A | 1/2015 |

* cited by examiner

DISPLAY PANEL AND DISPLAY DEVICE

CROSS-REFERENCE TO RELATED APPLICATION

The present disclosure claims a priority of the Chinese patent application No. 201510117227.9 filed on Mar. 17, 2015, which is incorporated herein by reference in its entirety.

TECHNICAL FIELD

The present disclosure relates to the field of display technology, in particular to a display panel and a display device.

BACKGROUND

Recently, along with the development of the display technology, double-sided display products have been widely used in various fields, e.g., subway display, bus display and advertisement display, and an image may be viewed by viewers at both sides of two display surfaces of the double-sided display product.

In the related art, the double-sided display is mainly achieved by the following two methods. As one of the two methods, a double-sided display panel is formed by combining a first display panel and a second display panel, e.g., two organic light-emitting diode (OLED) display panels, or two liquid crystal display (LCD) panels, which may be controlled, respectively. However, the resultant double-sided display panel includes two display panels, so the production cost of the display panel is relatively high and a thickness thereof is relatively large. As another method, the double-sided display may be achieved by a light-emitting layer of the double-sided display panel. For example, an OLED device or a quantum dot light-emitting device that emits light in a double-sided manner may be used as the light-emitting layer. Usually, this light-emitting layer is transparent, so reverse images are displayed at the two display surfaces of the double-sided display panel corresponding to two light-emitting surfaces of the light-emitting layer. In addition, due to the transparent light-emitting layer, it is impossible to control the light emitting elements corresponding to different pixel units to display different images in a double-sided manner. In order to solve the problem that an identical image is displayed by the two display surfaces of the double-sided display panel, the light-emitting layer of the double-sided display panel may be manufactured by a non-transparent OLED device or quantum dot light-emitting device, but a complex manufacture process is required.

SUMMARY

An object of the present disclosure is to provide a display panel and a display device, so as to reduce the production cost and a thickness of an existing display panel with a double-sided display function as well as to simplify a manufacture process thereof.

In one aspect, the present disclosure provides in one embodiment a display panel, including a first display surface, a second display surface, and a plurality of pixel units arranged in an array form between the first display surface and the second display surface. The pixel units include an active light-emitting layer that emits light in a double-sided manner. A first light-emitting surface of the active light-emitting layer faces the first display surface, and a second light-emitting surface of the active light-emitting layer faces the second display surface. The display panel further includes a first shielding layer that shields a portion of the first display surface and a second shielding layer that shields a portion of the second display surface. The first shielding layer includes a plurality of first shielding units, the second shielding layer includes a plurality of second shielding units, and the first shielding units and the second shielding units are arranged in a staggered manner in both a row direction and a column direction.

Alternatively, the first shielding unit is of a size identical to the second shielding unit. In this embodiment, after the display surfaces of the display panel are shielded by the first shielding units and the second shielding units with the identical size in a dot-like manner, respectively, the two display surfaces of the display panel have an approximately equal active display area.

Alternatively, each first shielding unit corresponds to at least one pixel unit, and each second shielding unit corresponds to at least one pixel unit. In this embodiment, one pixel unit or two or more pixel units may serve as a unit that is shielded in a dot-like manner, which may be set flexibly depending on a resolution or size of the display panel.

Alternatively, a surface of each of the first shielding unit and the second shielding unit facing the active light-emitting layer is a reflective surface. In the embodiment, the reflective surface is arranged at an inner side of each of the first shielding unit and the second shielding unit, so as to reflect a light beam from the active light-emitting layer, thereby to improve a light utilization rate.

Alternatively, the active light-emitting layer is one selected from the group consisting of an organic electroluminescent layer, a quantum dot light-emitting layer, a laser light-emitting layer and an inorganic light-emitting layer.

Alternatively, the display panel further includes a first substrate and a second substrate. The pixel unit is formed at a surface of the first substrate adjacent to the second substrate, the first shielding layer is arranged at a surface of the first substrate away from the second substrate or between the first substrate and the pixel units, and the second shielding layer is arranged at a surface of the second substrate away from, or adjacent to, the pixel unit.

Alternatively, the first substrate is an array substrate, and the second substrate is a color filter substrate or a packaging substrate.

Alternatively, the display panel further includes a black matrix arranged between the adjacent pixel units.

In another aspect, the present disclosure provides in one embodiment a display device including the above-mentioned display panel.

According to the embodiments of the present disclosure, the first shielding layer and the second shielding layer with patterns complementary to each other are arranged at the two display surfaces of the display panel, and the first shielding units of the first shielding layer and the second shielding units of the second shielding layer are arranged in a staggered manner in both the row direction and the column direction, so as to shield the first display surface and the second display surface of the display panel in a dot-like manner. As a result, it is able for the first display surface and the second display surface of the display panel to display an identical image or different images, so as to obtain a thin display panel with the double-sided display function in a low cost and a simple manufacturing process. In addition, the first display surface and the second display surface of the display panel are shielded in a dot-like manner, so it is able to prevent the occurrence of mutual interference between two adjacent pixel units, thereby to ensure a better display effect.

DETAILED DESCRIPTION

The present disclosure will be described hereinafter in conjunction with the drawings and embodiments. It should be appreciated that, identical or similar reference signs represent an identical or similar element, or elements having an identical or similar function. The following embodiments are for illustrative purposes only, but shall not be used to limit the scope of the present disclosure.

Figure 1:
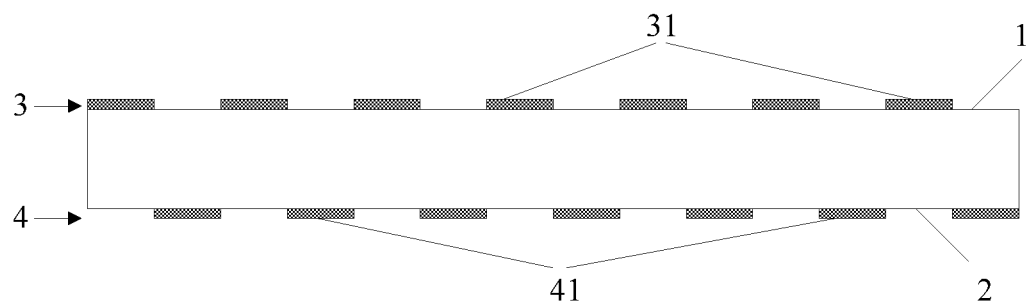
FIG. 1 is a sectional view of a display panel according to one embodiment of the present disclosure.

Referring to FIG. 1, the present disclosure provides in one embodiment a display panel, which includes a first display surface 1, a second display surface 2, and a plurality of pixel units (not shown) arranged in an array form between the first display surface 1 and the second display surface 2. The display panel further includes a first shielding layer 3 that shields a portion of the first display surface 1, and a second shielding layer 4 that shields a portion of the second display surface 2.

The first shielding layer 3 includes a plurality of first shielding units 31, the second shielding layer 4 includes a plurality of second shielding units 41, and the first shielding units 31 and the second shielding units 41 are arranged in a staggered manner in both a row direction and a column direction.

Figure 2:
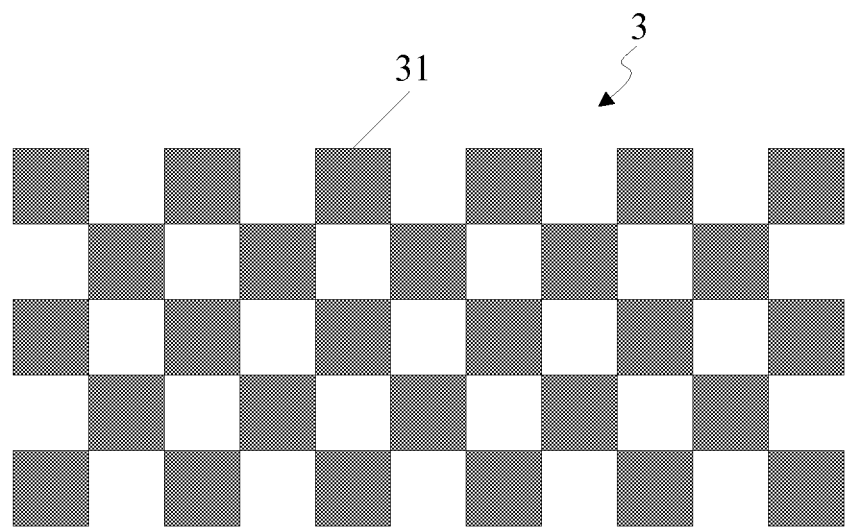
FIG. 2 is a schematic view showing a first shielding layer of the display panel according to one embodiment of the present disclosure.
Figure 3:
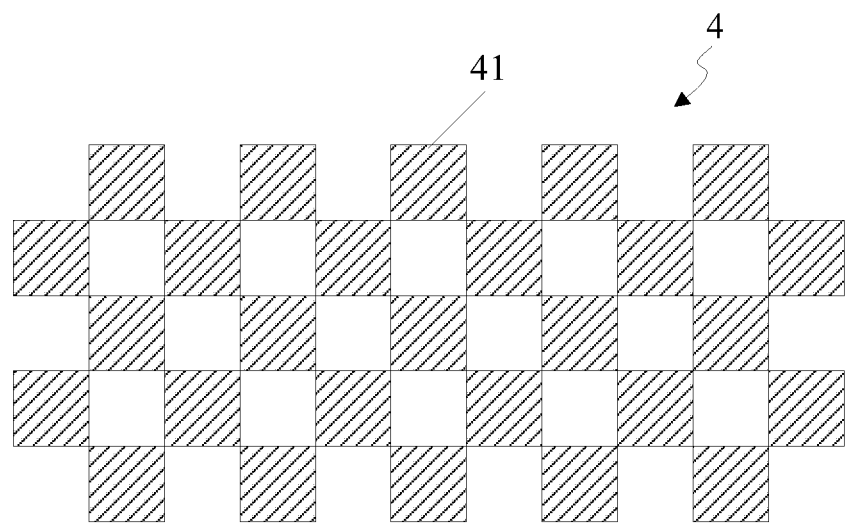
FIG. 3 is a schematic view showing a second shielding layer of the display panel according to one embodiment of the present disclosure.
Figure 4:
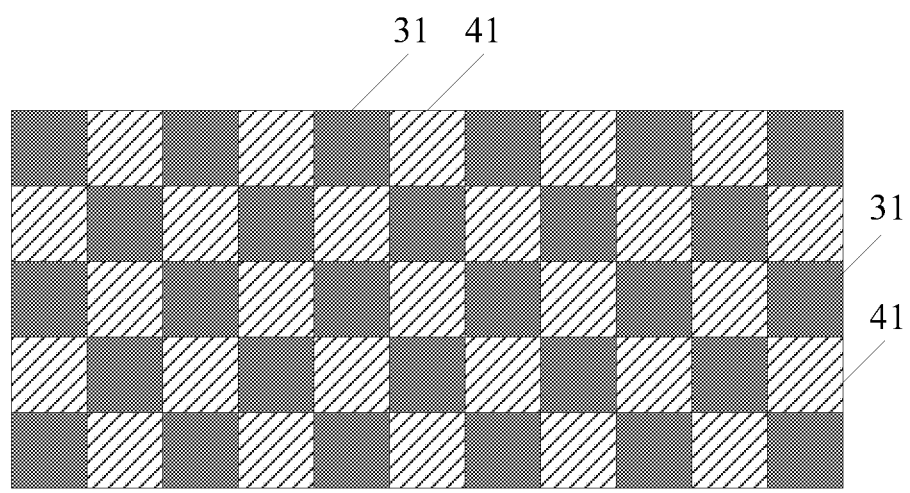
FIG. 4 is a schematic view showing the vertical projection of the first shielding layer and the second shielding layer onto the display panel according to one embodiment of the present disclosure.

Referring to FIGS. 2 and 3, which show the first shielding layer 3 and the second shielding layer 4, respectively, the first shielding units 31 are distributed evenly at the first shielding layer 3, and the second shielding units 41 are distributed evenly at the second shielding layer 4. Referring to FIG. 4, which shows the vertical projection of the first shielding layer 3 and the second shielding layer 4 onto the display panel, a pattern of the first shielding layer 3 is complementary to a pattern of the shielding layer 4, and the first shielding units 31 and the second shielding units 41 are arranged in a staggered manner in both the row direction and the column direction. A partial region of the first display surface 1 is shielded by the first shielding units 31 of the first shielding layer 3, i.e., parts of the pixel units are shielded by the first display surface 1. A region of the second display surface 2, other than a region corresponding to the region of the first display surface 1 shielded by the first shielding units 31 of the first shielding layer 3, is shielded by the second shielding units 41 of the second shielding layer 4, i.e., parts of the pixel units are shielded by the second display surface 2. As a result, it is able to shield the first display surface 1 and the second display surface 2 in a dot-like manner.

In this embodiment, the two display surfaces (e.g., the first display surface 1 and the second display surface 2) of the display panel are provided with the first shielding layer 3 and the second shielding layer 4 having patterns complementary to each other, and the first shielding units 31 of the first shielding layer 3 and the second shielding units 4 of the second shielding layer 4 are arranged in a staggered manner in both the row direction and the column direction, so as to shield the first display surface 1 and the second display surface 2 of the display panel in a dot-like manner. As a result, it is able for the first display surface 1 and the second display surface 2 of the display panel to display an identical image or different images, thereby to obtain a thin display panel with the double-sided display function in a low cost and a simple manufacturing process. In addition, the first display surface 1 and the second display surface 2 of the display panel are shielded in a dot-like manner, so it is able to prevent the occurrence of mutual interference between two adjacent pixel units, thereby to ensure a better display effect.

Alternatively, the first shielding unit 31 is of a size identical to the second shielding unit 41. In this embodiment, after the display surfaces of the display panel are shielded by the first shielding units 31 and the second shielding units 41 with the identical size in a dot-like manner, respectively, the two display surfaces of the display panel have an approximately equal active display area. Although merely a half of the pixel units for each of the first display surface 1 and the second display surface 2 is used for active display, the pixel units are distributed evenly, so it is still able to ensure a better display effect.

Alternatively, a shielding area of each first shielding unit 31 corresponds to at least one pixel unit, and a shielding area of each second shielding unit 41 corresponds to at least one pixel unit. For example, the shielding area of the first shielding unit 31 corresponds to one pixel unit, and the shielding area of the second shielding unit 41 corresponds to one pixel unit too. For another example, the shielding area of the first shielding unit corresponds to two adjacent pixel units arranged in the row or column direction, and the shielding area of the second shielding unit 41 corresponds to two adjacent pixel units arranged in the row or column direction too. For yet another example, the shielding area of the first shielding unit 31 corresponds to three adjacent pixel units arranged in the row or column direction, and the shielding area of the second shielding unit 41 corresponds to three adjacent pixel units arranged in the row or column direction too. In fact, on the premise of ensuring a display effect of the display panel, the shielding area of the first shielding unit 31 may correspond to a plurality of adjacent pixel units arranged in the row or column direction, and the shielding area of the second shielding unit 41 may correspond to a plurality of adjacent pixel units arranged in the row or column direction too. Alternatively, the shielding area of the first shielding unit 31 may be equal to that of the second shielding unit 41, a pattern of the first shielding unit 31 may be identical to that of the second shielding unit 41. In this embodiment, one pixel unit or two or more pixel units may serve as a dot that is shielded in a dot-like manner, which may be set flexibly depending on a resolution or size of the display panel.

Each pixel unit of the display panel includes an active light-emitting layer that emits light in a double-sided manner. Alternatively, the active light-emitting layer is one selected from the group consisting of an organic electroluminescent layer, a quantum dot light-emitting layer, a laser light-emitting layer and an inorganic light-emitting layer. A first light-emitting surface of the active light-emitting layer faces the first display surface, and a second light-emitting surface of the active light-emitting layer faces the second display surface. In this embodiment, the light-emitting layer of the pixel unit is the active light-emitting layer, so it is unnecessary to provide a backlight, thereby it is able to reduce a thickness of the display panel effectively.

Alternatively, a surface of each of the first shielding unit 41 and the second shielding unit 41 facing the active light-emitting layer is a reflective surface. In the embodiment, the reflective surface is arranged at an inner side of each of the first shielding unit and the second shielding unit, so as to reflect a light beam from the active light-emitting layer in an identical direction, thereby to improve a light utilization rate.

Figure 5:
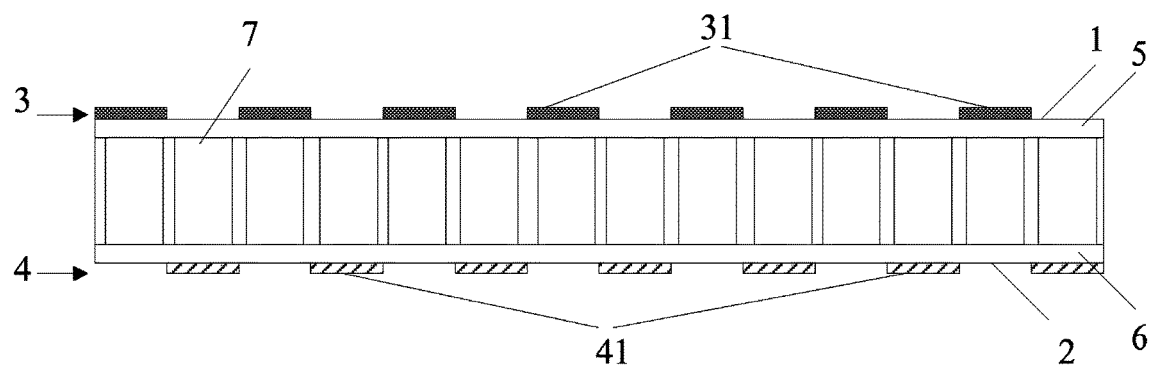
FIG. 5 is a schematic view showing the display panel according to one embodiment of the present disclosure.
Figure 6:
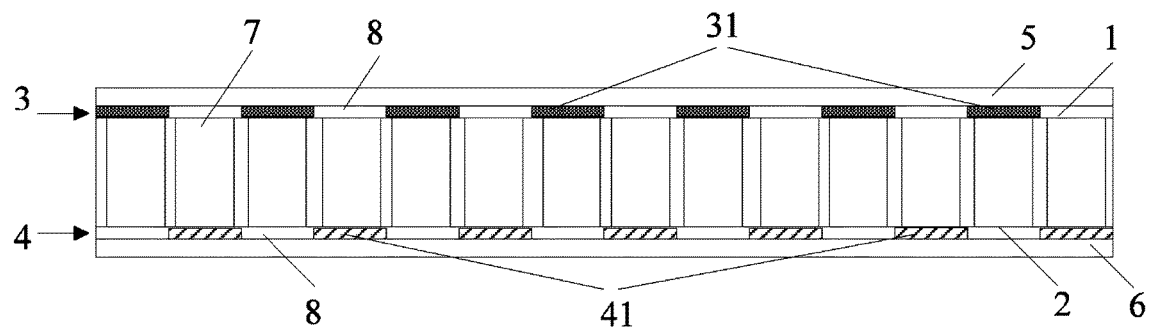
FIG. 6 is another schematic view showing the display panel according to one embodiment of the present disclosure.

The display panel further includes a first substrate and a second substrate. The pixel unit is formed at a surface of the first substrate adjacent to the second substrate, the first shielding layer is arranged at a surface of the first substrate away from the second substrate or between the first substrate and the pixel unit, and the second shielding layer is arranged at a surface of the second substrate away from, or adjacent to, the pixel unit. Referring to FIG. 5, the pixel unit 7 is formed at a surface of the first substrate 5 adjacent to the second substrate 6, the first shielding layer 3 is arranged at a surface of the first substrate 5 away from the second substrate 6, and the second shielding layer 4 is arranged at a surface of the second substrate 6 away from the pixel unit 7. Referring to FIG. 6, the pixel unit 7 is formed at a surface of the first substrate 5 adjacent to the second substrate 6, the first shielding layer 3 is arranged between the first substrate 5 and the pixel unit 7, and the second shielding layer 4 is arranged at a surface of the second substrate 6 adjacent to the pixel unit 7. In the structure as shown in FIG. 6, a blank region between the first shielding units of the first shielding layer 3 needs to be filled with a transparent material 8, so as to form a flat surface, thereby to facilitate the manufacture of the pixel unit 7. Of course, the first shielding layer 3 may be arranged at a surface of the first substrate 5 away from the second substrate 6, and the second shielding layer 4 may be arranged at a surface of the second substrate 6 adjacent to the pixel unit 7; or the first shielding layer 3 may be arranged between the first substrate 5 and the pixel unit 7, and the second shielding layer 4 may be arranged at a surface of the second substrate 6 away from the pixel unit 7. Alternatively, the display panel is of a structure as shown in FIG. 5, so as to simplify the structure and the manufacture process.

Alternatively, the first substrate 5 may be an array substrate, and the second substrate 6 may be a color filter substrate or a packaging substrate depending on a type of the active light-emitting layer of the pixel unit 7.

Alternatively, the display panel further includes a black matrix (not shown) is arranged between the adjacent pixel units, so as to prevent the occurrence of light leakage as well as the occurrence of optical crosstalk between the adjacent pixel units.

The present disclosure further provides a display device including the above-mentioned display panel.

According to the embodiments of the present disclosure, the first shielding layer and the second shielding layer with patterns complementary to each other are arranged at the two display surfaces of the display panel, and the first shielding units of the first shielding layer and the second shielding units of the second shielding layer are arranged in a staggered manner in both the row direction and the column direction, so as to shield the first display surface and the second display surface of the display panel in a dot-like manner. As a result, it is able for the first display surface and the second display surface of the display panel to display an identical image or different images, so as to obtain a thin display panel with the double-sided display function in a low cost and a simple manufacturing process. In addition, the first display surface and the second display surface of the display panel are shielded in a dot-like manner, so it is able to prevent the occurrence of mutual interference between two adjacent pixel units, thereby to ensure a better display effect.

The above are merely the preferred embodiments of the present disclosure. Obviously, a person skilled in the art may make further modifications and improvements without departing from the spirit of the present disclosure, and these modifications and improvements shall also fall within the scope of the present disclosure.

What is claimed is:

1. A display panel, comprising a first display surface, a second display surface, and a plurality of pixel units arranged in an array form between the first display surface and the second display surface, wherein the pixel units comprise an active light-emitting layer that emits light in a double-sided manner, a first light-emitting surface of the active light-emitting layer faces the first display surface, and a second light-emitting surface of the active light-emitting layer faces the second display surface, the display panel further comprises a first shielding layer that shields a portion of the first display surface and a second shielding layer that shields a portion of the second display surface, the first shielding layer comprises a plurality of first shielding units, the second shielding layer comprises a plurality of second shielding units, and the first shielding units and the second shielding units are arranged in a staggered manner in both a row direction and a column direction, wherein each first shielding unit corresponds to at least one pixel unit, each second shielding unit corresponds to at least one pixel unit, and one or more of the pixel units do not include either of the first shielding unit or the second shielding unit so that the light emitted by the one or more of the pixel units through the active light-emitting layer is not shielded by any of the first shielding units and the second shielding units, and the first display surface and the second display surface have an equal active display area.

2. The display panel according to claim 1, wherein the first shielding unit is of a size identical to the second shielding unit.

3. The display panel according to claim 1, wherein a surface of each of the first shielding unit and the second shielding unit facing the active light-emitting layer is a reflective surface.

4. The display panel according to claim 3, wherein the active light-emitting layer is one selected from the group consisting of an organic electroluminescent layer, a quantum dot light-emitting layer, a laser light-emitting layer and an inorganic light-emitting layer.

5. The display panel according to claim 1, further comprising a first substrate and a second substrate, wherein the pixel unit is formed at a surface of the first substrate adjacent to the second substrate, the first shielding layer is arranged at a surface of the first substrate away from the second substrate or between the first substrate and the pixel units, and the second shielding layer is arranged at a surface of the second substrate away from, or adjacent to, the pixel unit.

6. The display panel according to claim 5, wherein the first substrate is an array substrate, and the second substrate is a color filter substrate or a packaging substrate.

7. The display panel according to claim 1, further comprising a black matrix arranged between the adjacent pixel units.

8. A display device comprising the display panel according to claim 1.

9. The display device according to claim 8, wherein the first shielding unit is of a size identical to the second shielding unit.

10. The display device according to claim 8, wherein a surface of each of the first shielding unit and the second shielding unit facing the active light-emitting layer is a reflective surface.

11. The display device according to claim 10, wherein the active light-emitting layer is one selected from the group consisting of an organic electroluminescent layer, a quantum dot light-emitting layer, a laser light-emitting layer and an inorganic light-emitting layer.

12. The display device according to claim 8, further comprising a first substrate and a second substrate, wherein the pixel unit is formed at a surface of the first substrate adjacent to the second substrate, the first shielding layer is arranged at a surface of the first substrate away from the second substrate or between the first substrate and the pixel unit, and the second shielding layer is arranged at a surface of the second substrate away from, or adjacent to, the pixel unit.

13. The display device according to claim 12, wherein the first substrate is an array substrate, and the second substrate is a color filter substrate or a packaging substrate.

14. The display device according to claim 8, wherein the display panel further comprises a black matrix arranged between the adjacent pixel units.

* * * * *